(12) United States Patent
Tsuji et al.

(10) Patent No.: US 12,507,365 B2
(45) Date of Patent: Dec. 23, 2025

(54) POWER SUPPLY DEVICE AND PRODUCTION METHOD THEREOF

(71) Applicant: SHIMADZU CORPORATION, Kyoto (JP)

(72) Inventors: Masafumi Tsuji, Kyoto (JP); Yohei Ukai, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 175 days.

(21) Appl. No.: 18/585,989

(22) Filed: Feb. 23, 2024

(65) Prior Publication Data
US 2024/0314958 A1  Sep. 19, 2024

(30) Foreign Application Priority Data
Mar. 17, 2023  (JP) .................. 2023-043469

(51) Int. Cl.
*H05K 3/28* (2006.01)
*H05K 5/00* (2006.01)
*H05K 5/04* (2006.01)
*H05K 5/06* (2006.01)

(52) U.S. Cl.
CPC ............ *H05K 5/065* (2013.01); *H05K 3/284* (2013.01); *H05K 5/0065* (2013.01); *H05K 5/04* (2013.01)

(58) Field of Classification Search
CPC ...... H05K 5/065; H05K 3/284; H05K 5/0065; H05K 5/04
USPC .......................................................... 361/748
See application file for complete search history.

(56) References Cited

U.S. PATENT DOCUMENTS 4,796,159 A * 1/1989 Miksche .............. H05K 7/1454
361/796

FOREIGN PATENT DOCUMENTS

JP    2021-031636 A    12/2023

* cited by examiner

*Primary Examiner* — Binh B Tran
(74) *Attorney, Agent, or Firm* — Muir Patent Law, PLLC (57) ABSTRACT

A power supply device is provided with an electronic component assembly configuring a power supply, an encapsulating material encapsulating the electronic component assembly, the encapsulating material having a first linear expansion coefficient, an enclosure member filled with the encapsulating material, a portion of the enclosure member in contact with the encapsulating material having a second coefficient of linear expansion coefficient, and a housing formed by a member having a third linear expansion coefficient. The first linear expansion coefficient of the encapsulating material is closer to the second linear expansion coefficient of the enclosure member than the third linear expansion coefficient of a member forming the housing.

8 Claims, 5 Drawing Sheets

POWER SUPPLY DEVICE AND PRODUCTION METHOD THEREOF

CROSS-REFERENCE TO RELATED APPLICATIONS

The related application number JP2023-043469, entitled "Power Supply Device and Production Method Thereof," filed on Mar. 17, 2023, invented by Masafumi TSUJI and Yohei UKAI, upon which this patent application is based, is hereby incorporated by reference in its entirety.

BACKGROUND OF THE INVENTION

Field of the Invention

The present invention relates to a power supply device and a production method of the power supply device.

Description of the Related Art

The following description sets forth the inventor's knowledge of the related art and problems therein and should not be construed as an admission of knowledge in the prior art.

Conventionally, a device is known in which an electronic component assembly, an encapsulating material for encapsulating the electronic component assembly, and a housing are provided. Such a device is disclosed in, for example, Japanese Unexamined Patent Application Publication No. 2021-31636.

The above-described Japanese Patent Application Publication No. 2021-31636 discloses an electronic device (power supply device) including a housing, a circuit board (electronic component assembly), and a curing material (encapsulating material) composed of a resin composition filled between the housing and the circuit board. In the electronic device described in Japanese Patent Application Publication No. 2021-31636, the circuit board is encapsulated by a resin composition. Further, the above-described Japanese Patent Application Publication No. 2021-31636 discloses that an electronic device is produced by filling a space between a metal housing and a circuit board with a resin composition and then curing the filled resin composition.

Although not explicitly described in the above-described Japanese Patent Application Publication No. 2021-31636, when filling the inside of the housing with a resin composition, there is a risk that the resin composition filled and before being cured may leak out of the housing through gaps formed in the corners and other parts of the housing. Therefore, although not explicitly described in the above-described Japanese Patent Application Publication No. 2021-31636, it is necessary to perform welding or joining work at the corners and other portions of the housing to prevent the resin composition (encapsulating material) filled in the inner space of the housing from leaking through the above-described gaps. Therefore, it is considered that complicated work is required. Under the circumstances, there is a need for a power supply device capable of suppressing leakage of an encapsulating material filled in the housing to the outside as well as suppressing the complication of the production process.

SUMMARY OF THE INVENTION

The present invention has been made to solve the above-described problems. One object of the present invention is to provide a power supply device and a production method of a power supply device capable of suppressing leakage of an encapsulating material filled in the housing to the outside while suppressing the complexity of the production process.

In order to attain the above-described object, a power supply device according to a first aspect of the present invention includes:

an electronic component assembly configuring a power supply;

an encapsulating material encapsulating the electronic component assembly, the encapsulating material having a first linear expansion coefficient;

an enclosure member with an inside thereof filled with the encapsulating material so as to cover the electronic component assembly, a portion of the enclosure member in contact with the encapsulating material having a second linear expansion coefficient; and a housing in which the electronic component assembly, the encapsulating material, and the enclosure member are arranged therein, the housing being formed by a member having a third linear expansion coefficient, wherein the first linear expansion coefficient of the encapsulating material is closer to the second linear expansion coefficient of the enclosure member than the third linear expansion coefficient of the member forming the housing.

In order to attain the above-described object, a production method of a power supply device according to a second aspect of the present invention includes:

a step of arranging an enclosure member in which an electronic component assembly constituting a power supply is accommodated in a space serving an inside of a housing as a power supply device main body; and a step of encapsulating the electronic component assembly by filling an inside of the enclosure member arranged in the space serving the inside of the housing with the encapsulating material.

The power supply device according to the first aspect of the present invention is equipped with an enclosure member filled with an encapsulating material so as to cover the electronic component assembly therein as described above. With this configuration, it is possible to surround the encapsulating material with the enclosure member without welding or joining the corners of the housing or other portions thereof. Therefore, it is possible to suppress leakage of the encapsulating material filled in the housing to the outside while preventing the production process from becoming complicated.

Further, as described above, it is equipped with the enclosure member filled with the encapsulating material, and the portion of the enclosure member in contact with the encapsulating material has a second linear expansion coefficient. The first linear expansion coefficient of the encapsulating material is closer to the second linear expansion coefficient of the enclosure member than the third linear expansion coefficient of the member forming the housing. By providing the enclosure member having the linear expansion coefficient as described above so as to be in contact with the encapsulating material between the housing and the encapsulating material, it is possible to reduce the difference between the linear expansion coefficient of the member in contact with the encapsulating material and the linear expansion coefficient of the encapsulating material as compared with the case in which the encapsulating material and the housing are in contact with each other.

For this reason, occurrence of cracks in the encapsulating material caused by the difference between the linear expansion coefficient of the member in contact with the encapsulating material and the encapsulating material can be suppressed. Therefore, occurrence of electrical discharges from the electronic component assembly in the gaps caused by cracks in the encapsulating material can be suppressed.

Further, the production method of the power supply device according to the second aspect of the present invention includes a step of encapsulating the electronic component assembly by filling an inside of the enclosure member arranged in a space serving the inside of the housing with the encapsulating material. With this configuration, it is possible to surround the encapsulating material with the enclosure member without welding or joining the corners of the housing or other portions thereof. Therefore, it is possible to suppress leakage of the encapsulating material filled in the housing to the outside while preventing the production process from becoming complicated.

BRIEF DESCRIPTION OF THE DRAWINGS

The preferred embodiments of the present invention are shown by way of example, and not limitation, in the accompanying figures.

DETAILED DESCRIPTION OF THE PREFERRED EMBODIMENTS

Hereinafter, some embodiments in which the present invention is embodied will be described with reference to the attached drawings.
(Overall Configuration of Power Supply Device)

Referring to FIG. 1 to FIG. 6, the overall configuration of a power supply device 100 according to one embodiment of the present invention will be described.

Figure 1:
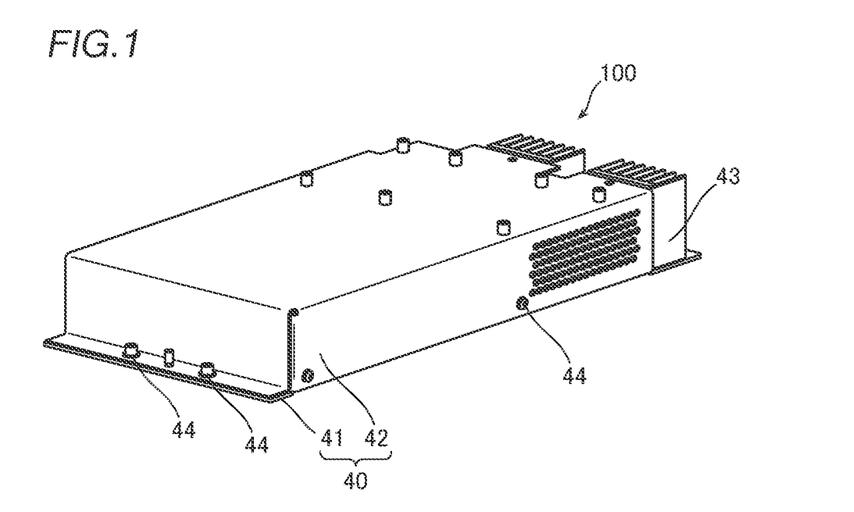
FIG. 1 is a perspective view showing a power supply device according to one embodiment.
Figure 2:
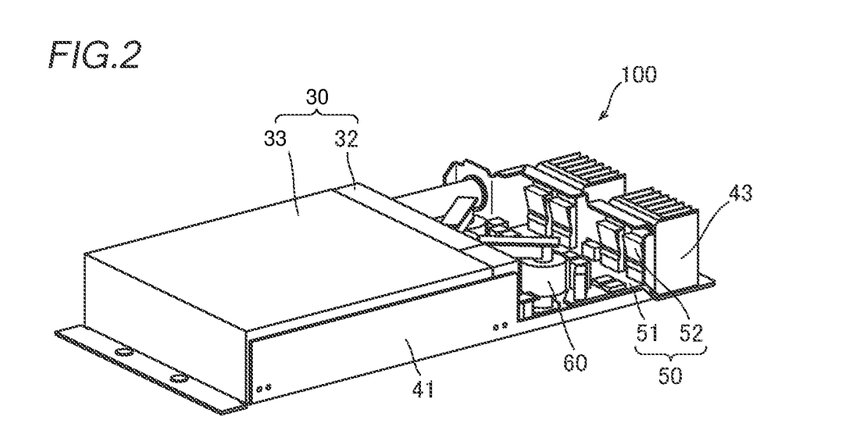
FIG. 2 is a perspective view showing a power supply device in which a second case is detached.
Figure 3:
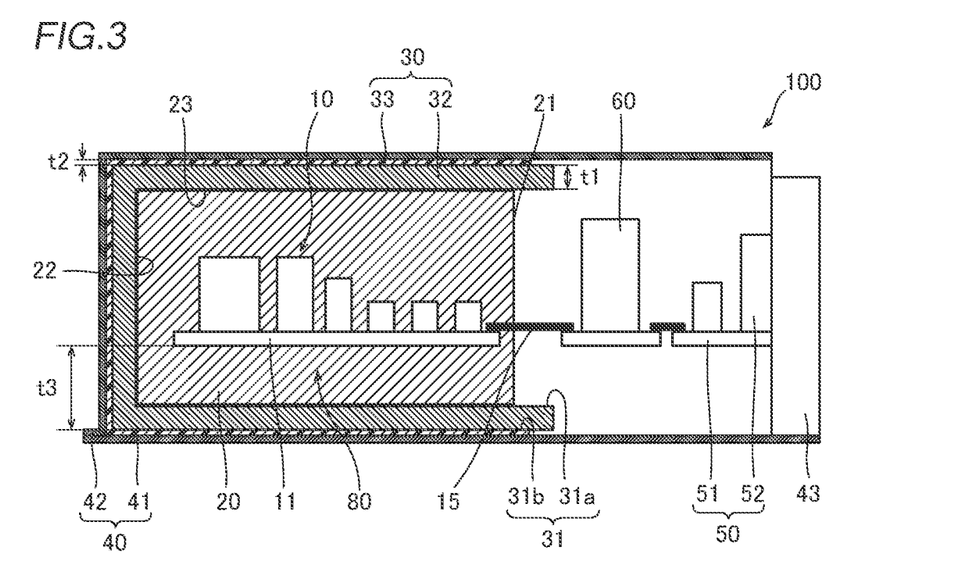
FIG. 3 is a schematic cross-sectional view for explaining a power supply device according to one embodiment.

FIG. 1 is a perspective view of a power supply device 100 according to an embodiment. FIG. 2 is a perspective view of the power supply device 100 in which a second case 42 (see FIG. 1) of a housing 40, which will be described below, is removed for convenience of explanation. FIG. 3 is a schematic cross-sectional view for explaining the power supply device 100 according to one embodiment.

As shown in FIG. 3, the power supply device 100 is equipped with the first electronic component assembly 10, an encapsulating material 20, an enclosure member 30, a housing 40, a second electronic component assembly 50, and a transformer 60. The power supply device 100 is configured to convert an AC voltage input from a power supply into a DC high voltage and output it to, for example, an X-ray tube in an X-ray imaging apparatus.

Note that the first electronic component assembly 10 is one example of the "electronic component assembly" as recited in claims. Note that the first electronic component assembly 10, the second electronic component assembly 50, and the transformer 60 are not hatched for convenience of illustration.

The second electronic component assembly 50 (see FIG. 4) is configured to change supply and cutoff of the power from a power supply, as well as to output an AC voltage of 24 V. The second electronic component assembly 50 can change its ON/OFF state based on a control signal controlled by a controller, which is not shown in the figure. The second electronic component assembly 50 includes a second circuit board 51 and electronic elements. The electronic elements include, for example, a switching element 52. The switching element 52 is mounted on the second circuit board 51. The switching element 52 is, for example, an FET (Field Effect Transistor). The second electronic component assembly 50 is arranged inside the housing 40. In detail, the second circuit board 51 (see FIG. 2) of the second electronic component assembly 50 is attached to the first case 41, which is described below, of the housing 40. The second electronic component assembly 50 is not encapsulated by the encapsulating material 20.

The transformer 60 is configured to boost the voltage input from the second electronic component assembly 50. The transformer 60 is arranged between the second circuit board 51 of the second electronic component assembly 50 and the first circuit board 11 of the first electronic component assembly 10, which will be described later. The transformer 60 (see FIG. 2) is attached to the first case 41 of the housing 40. The transformer 60 is not encapsulated by the encapsulating material 20.

The first electronic component assembly 10 constitutes a high-voltage power supply. The first electronic component assembly 10 includes a first circuit board 11, a high-voltage generation circuit 12 (see FIG. 4), capacitors 13 (see FIG. 4), and diodes 14 (see FIG. 4). The first circuit board 11 mounts a high-voltage generation circuit 12. The first electronic component assembly 10 is configured to convert the voltage of the AC power input from the transformer 60 into a high-voltage DC power using the high-voltage generation circuit 12. The first electronic component assembly 10 is configured to output the converted DC high-voltage power to, for example, an X-ray tube.

Figure 4:
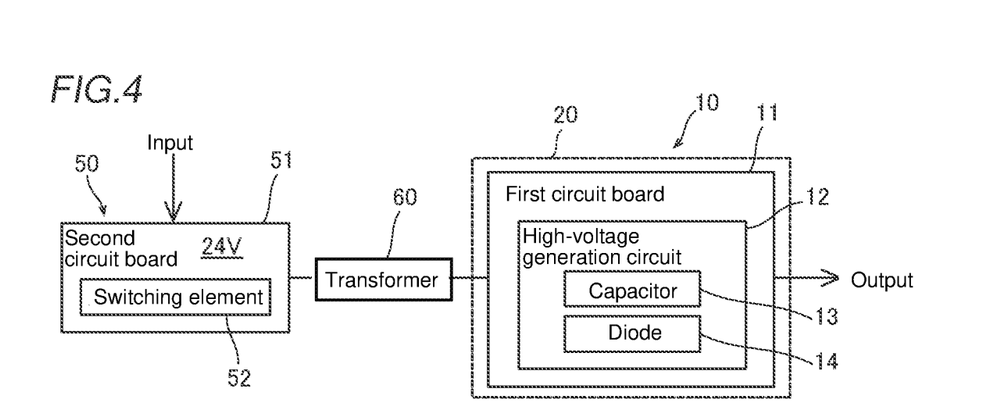
FIG. 4 is a schematic diagram for explaining one example of a first electronic component assembly, a transformer, and a second electronic component assembly.
Figure 5:
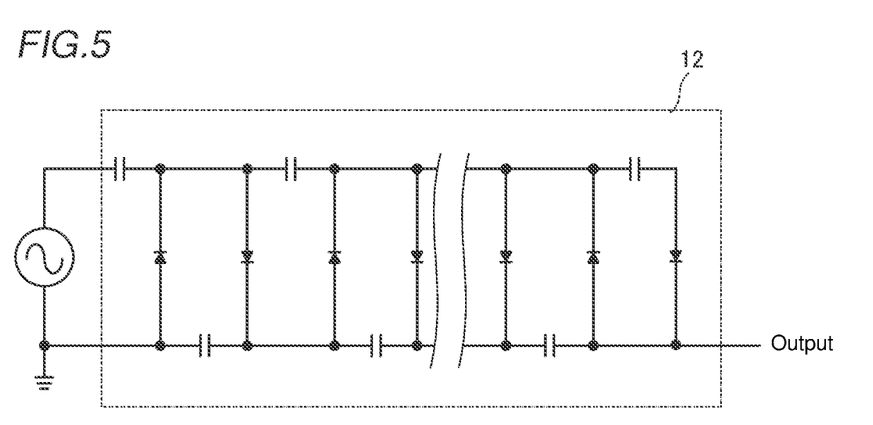
FIG. 5 is a circuit diagram of one example of a high-voltage generation circuit.

As shown in FIG. 4 and FIG. 5, the high-voltage generation circuit 12 includes capacitors 13 and diodes 14. The first electronic component assembly 10 is encapsulated by the encapsulating material 20. The first electronic component assembly 10 is electrically connected to the transformer 60 via a cable 15. The cable 15 is connected to the first electronic component assembly 10 at one end covered by the encapsulating material 20 and to the transformer 60 at the other end not covered by the encapsulating material 20.

The encapsulating material 20 encapsulates the first electronic component assembly 10. The encapsulating material 20 can be, for example, a resin material, such as, e.g., urethane and silicone. The encapsulating material 20 has a first linear expansion coefficient. In the case where the encapsulating material 20 is urethane, the first linear expansion coefficient is, for example, $1.4 \times 10^{-4}$ [1/° C.].

Further, in the case where the encapsulating material 20 is silicone, the first linear expansion coefficient is, for example, $3.5 \times 10^{-4}$ [1/° C.]. The encapsulating material 20 includes a first face 21 exposed through the opening 31 of the enclosure member 30, a second face 22 facing the first face 21, and a side face 23 connecting the first face 21 and the second face 22. In this embodiment, the encapsulating material 20 encapsulating the first electronic component assembly 10 has a rectangular shape.

The first linear expansion coefficient of the encapsulating material 20 is configured to be closer to the second linear expansion coefficient of the mold member 32 in contact with the encapsulating material 20 in the enclosure member 30 than the third linear expansion coefficient of a member constituting the housing 40.

The enclosure member 30 is filled with the encapsulating material 20 so as to cover the first electronic component assembly 10 therein. The enclosure member 30 includes an opening 31 through which the encapsulating material 20 is exposed. The enclosure member 30 includes a sheet-like mold member 32 and a bag member 33 having a bag shape. The mold member 32 is arranged between the bag member 33 and the first electronic component assembly 10. In other words, the mold member 32 is provided on the inner side of the bag member 33, and the bag member 33 is provided on the outer side of the mold member 32.

Figure 6:
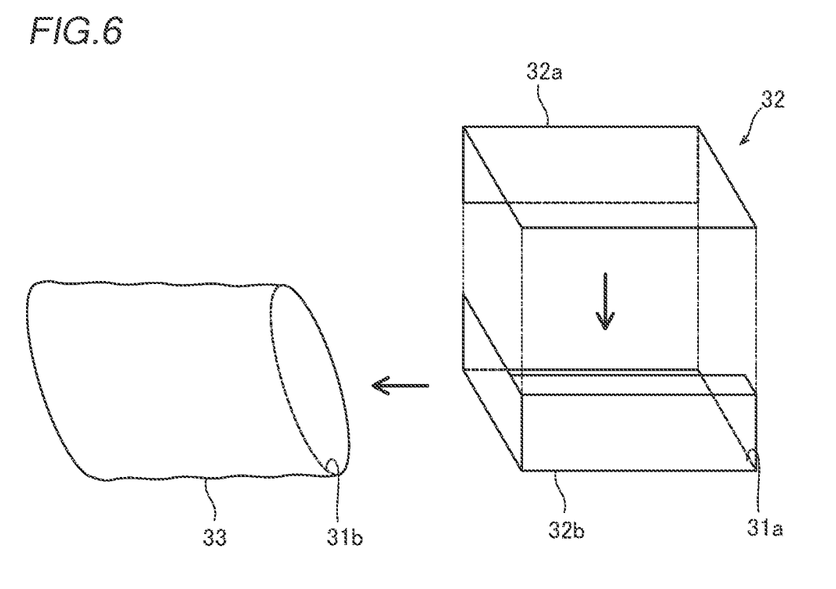
FIG. 6 is a schematic diagram for explaining a mold member and a bag member.

The mold member 32 is provided so as to be in contact with the encapsulating material 20. The mold member 32 is provided so as to cover the second face 22 and the side face 23 of the encapsulating material 20 without covering the first face 21 of the encapsulating material 20. As shown in FIG. 6, the mold member 32 is formed of two pieces of sheet-like resin members composed of a first mold member 32a and a second mold member 32b.

The first mold member 32a is formed by folding a sheet-like resin member so as to cover two adjacent side faces 23 of the encapsulating material 20. The second mold member 32b is formed by folding a sheet-like resin member so as to cover the second face 22 of the encapsulating material 20, two adjacent side faces 23 of the encapsulating material 20 not covered by the first mold member 32a, and one side face 23 of the encapsulating material 20 covered by the first mold member 32a.

The first mold member 32a and the second mold member 32b are bonded at one side face 23 of the encapsulating material 20 covered in an overlapped manner. The first face 21 of the encapsulating material 20 is not covered by the first mold member 32a and the second mold member 32b. The mold member 32 has a mold member opening 31a at the portion corresponding to the first face 21 of the encapsulating material 20. The mold member 32 is formed along the inner surface of the housing 40 via the bag member 33. The mold member 32 is formed by folding each of two pieces of sheet-like resin members, and therefore, there is no need to produce complex molds or the like. For this reason, it is possible to suppress the increase in production costs.

The mold member 32 is formed of a material that is harder than the bag member 33. Further, as shown in FIG. 3, the thickness t1 of the mold member 32 is thicker than the thickness t2 of the bag member 33. Note that in FIG. 3, for the sake of description, the thicknesses t1 of the mold member 32 and the thickness t2 of the bag member 33 are emphasized in the figure. The mold member 32 can be made of a resin material, such as, e.g., polycarbonate and polyethylene terephthalate.

The enclosure member 30 has a second linear expansion coefficient at the portion in contact with the encapsulating material 20. In this embodiment, the mold member 32 has a second linear expansion coefficient. In the case where the mold member 32 is made of polycarbonate, the second linear expansion coefficient is, for example, $6.5 \times 10^{-5}$ [1/° C.]. In the case where the mold member 32 is made of polyethylene terephthalate, the second linear expansion coefficient is, for example, $6.0 \times 10^{-5}$ [1/° C.]. The mold member 32 can be produced by punching out a sheet-like resin material using, for example, a Thomson mold. Note that the production method of the mold member 32 is not particularly limited.

The bag member 33 is provided so as to be in contact with the mold member 32. The bag member 33 is provided so as to wrap the mold member 32 covering the second face 22 and the side face 23 of the encapsulating material 20. The bag member 33 has a bag member opening 31b at the portion corresponding to the first face 21 of the encapsulating material 20. The bag member opening 31b is not closed.

The bag member 33 can be made of a resin material, such as, e.g., polyvinyl chloride and polyethylene. In the case where the bag member 33 is made of polyvinyl chloride, the linear expansion coefficient of the bag member 33 is, for example, $7.0 \times 10^{-5}$ [1/° C.]. In the case where the bag member 33 is made of polyethylene, the linear expansion coefficient of the bag member 33 is, for example, $15.0 \times 10^{-5}$ [1/° C.].

The bag member 33 is arranged so as to be in contact with the outer surface of the mold member 32 and the inner surface of the housing 40. The size of the bag member 33 is formed to conform to the inner surface of the housing 40.

The housing 40 accommodates the second electronic component assembly 50, the transformer 60, the first electronic component assembly 10, the encapsulating material 20, and the enclosure member 30 therein. The housing 40 is configured as the main body of the power supply device 100. The housing 40 includes a first case 41 and a second case 42. The first case 41 and the second case 42 are overlapped at the portion corresponding to the facing side faces 23 of the encapsulating material 20 and are joined together by screws 44 (see FIG. 1).

Further, the housing 40 is equipped with a heat sink 43. The heat sink 43 is provided at the end of the second electronic component assembly 50 side of the first case 41 of the housing 40. The heat sink 43 has a plurality of heat-dissipating fins. The heat sink 43 is provided at a position corresponding to the switching element 52 of the second electronic component assembly 50 via a sheet metal. The heat sink 43 dissipates the heat generated from the switching element 52 to the outside of the housing 40.

The housing 40 is formed by, for example, sheet metal processing. For example, an aluminum alloy can be used as the material for the housing 40. The housing 40 has a third linear expansion coefficient. In the case where the housing 40 is made of an aluminum alloy, the third linear expansion coefficient is, for example, $23.5 \times 10^{-6}$ [1/° C.].

(Production Method of Power Supply Device)

Figure 7:
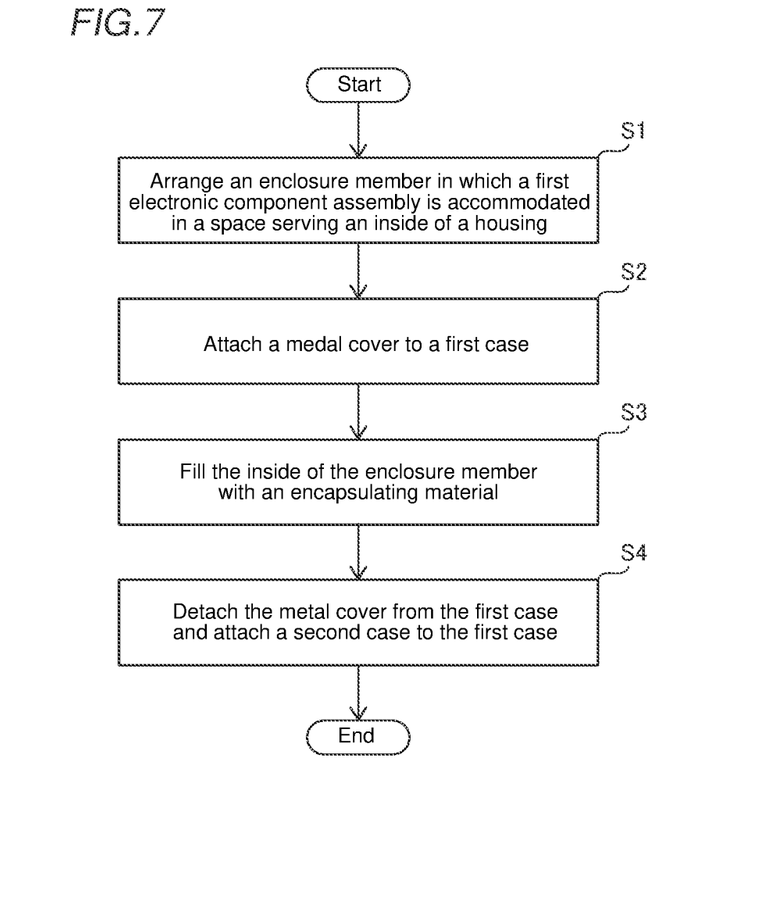
FIG. 7 is a flowchart for explaining a production method of a power supply device according to one embodiment.

Next, with reference to FIG. 7, the production method of the power supply device 100 according to this embodiment will be described.

First, in Step S1, the enclosure member 30 in which the first electronic component assembly 10 is accommodated therein is arranged in a space serving the inside of the housing 40 as the main body of the power supply device 100.

Specifically, the second electronic component assembly 50, the transformer 60, the first electronic component assembly 10, and the heat sink 43 are mounted to the first case 41 of the housing 40. In addition, soldering of the cable 15 (see FIG. 3) and other components is performed. Then, the enclosure member 30 composed of the bag member 33 and the mold member 32 is covered so as to surround the first electronic component assembly 10 from the side opposite to the heat sink 43 in the first case 41 (see FIG. 2).

Figure 8:
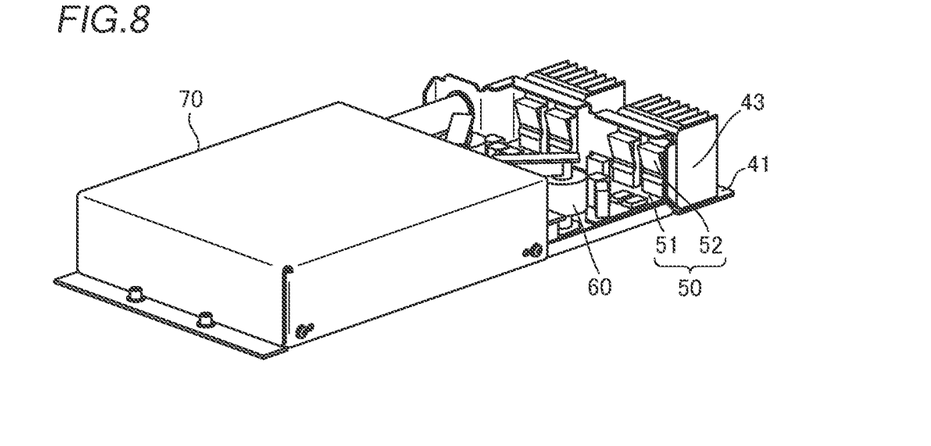
FIG. 8 is a perspective view for explaining a first case to which a metal cover is attached.

Next, in Step S2, a metal cover 70 as a jig (see FIG. 8) is attached to the first case 41 of the housing 40. Note that the metal cover 70 as a jig differs from the second case 42 in that it does not have a portion covering the second electronic component assembly 50 and the transformer 60.

Figure 9:
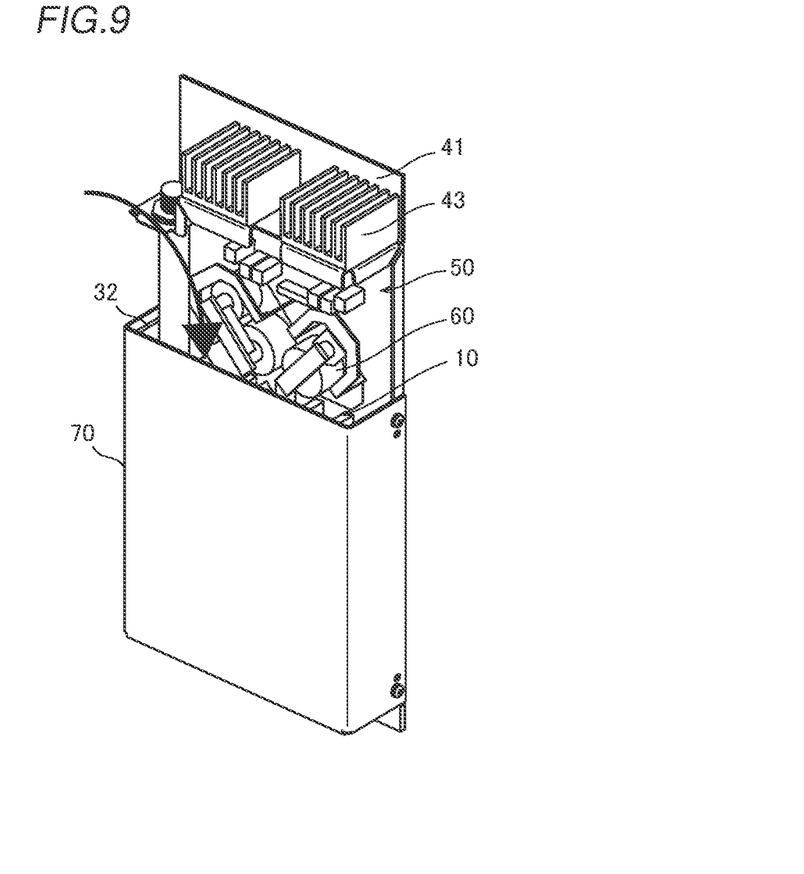
FIG. 9 is a schematic view for explaining filling of an encapsulating material.

Next, in Step S3, the first electronic component assembly 10 is encapsulated by filling the encapsulating material 20 into the inside of the enclosure member 30 arranged in the space serving the inside of the housing 40 in a state in which the opening 31 of the enclosure member 30 is facing upward (see FIG. 9).

In the posture (see FIG. 9) in which the opening 31 of the enclosure member 30 faces upward before filling the encapsulating material 20, the first electronic component assembly 10 becomes a state supported by cantilevering against the second electronic component assembly 50 and the transformer 60 attached to the first case 41 via the cable 15 (see FIG. 3). In the state in which the first electronic component assembly 10 is supported by cantilevering, a space 80 (see FIG. 3) is formed between the outer surface of the first electronic component assembly 10 and the inner surface of the mold member 32. The encapsulating material 20 is filled into the space 80 between the outer surface of the first electronic component assembly 10 and the inner surface of the mold member 32.

Further, after filling the encapsulating material 20, the first electronic component assembly 10 is positioned in a state in which the first electronic component assembly 10 is supported by cantilevering so that the thickness t3 (see FIG. 3) of the encapsulating material 20 and the mold member 32 from the outer surface of the first electronic component assembly 10 can maintain a predetermined thickness. The predetermined thickness is a thickness that can prevent electrical discharge from the first electronic component assembly 10. As a result, the encapsulating material 20 filled inside the enclosure member 30 is filled while ensuring a preset thickness between the first electronic component assembly 10 and the first case 41 and between the first electronic component assembly 10 and the second case 42 to be installed later.

Next, in Step S4, the metal cover 70 is removed from the first case 41 of the housing 40, and the second case 42 is screwed to the first case 41 by screws 44. Note that the bag member opening 31b of the bag member 33 is not closed.

(Effects of Power Supply Device of this Embodiment)

In the power supply device 100 of this embodiment, the following effects can be obtained.

In this embodiment, as described above, it is provided with the enclosure member 30 filled with the encapsulating material 20 so as to cover the first electronic component assembly 10 therein. With this, it is possible to surround the encapsulating material 20 with the enclosure member 30 without welding or joining the corners of the housing 40 or other portions thereof. Therefore, it is possible to suppress leakage of the encapsulating material 20 filled in the housing 40 to the outside while preventing the production process from becoming complicated.

Further, in this embodiment, as described above, the first linear expansion coefficient of the encapsulating material 20 is closer to the second linear expansion coefficient of the mold member 32 in contact with the encapsulating material 20 in the enclosure member 30 than the third linear expansion coefficient of the member forming the housing 40. By providing the mold member 32 having the linear expansion coefficient as described above between the housing 40 and the encapsulating material 20 so as to be in contact with the encapsulating material 20, the difference between the linear expansion coefficient of the member in contact with the encapsulating material 20 and the linear expansion coefficient of the encapsulating material 20 can be reduced as compared with the case in which the encapsulating material 20 and the housing 40 are in contact with each other. Therefore, it is possible to suppress the occurrence of cracks in the encapsulating material 20 caused by the difference between the linear expansion coefficient of the member in contact with the encapsulating material 20 and the linear expansion coefficient of the encapsulating material 20. Therefore, it is possible to suppress the occurrence of electrical discharges from the first electronic component assembly 10 in the space caused by cracks in the encapsulating material 20.

Further, in this embodiment, as described above, the member forming the housing 40 is made of metal, and the enclosure member 30 is made of resin. The adhesion between the encapsulating material 20 and the housing 40 can be suppressed by using the enclosure member 30 made of resin, which is easier to mold than metal while securing the strength of the housing 40 by forming the housing 40 with metal. Therefore, it is possible to assuredly suppress the occurrence of cracks in the encapsulating material 20 caused by the difference in linear expansion coefficient between the metal housing 40 whose linear expansion coefficient is smaller than that of the resin and the encapsulating material 20.

Further, in this embodiment, as described above, the enclosure member 30 includes the bag member 33 having a bag shape and the sheet-like mold member 32 arranged between the bag member 33 and the first electronic component assembly 10, the mold member 32 having a second linear expansion coefficient and being harder than the bag member 33. Here, during the filling of the encapsulating material 20 or the curing of the encapsulating material 20, wrinkles can occur in the bag member 33. In the event that the wrinkles in the bag member 33 are transferred to the encapsulating material 20, a gap similar to a crack will be formed in the transferred portion of the wrinkles in the encapsulating material 20.

Therefore, by arranging the sheet-like mold member 32, which is harder than the bag member 33, between the bag member 33 and the first electronic component assembly 10, it is possible to suppress the transfer of the wrinkled shape to the encapsulating material 20 even if the bag member 33 becomes wrinkled due to loosening. Therefore, it is possible to suppress the partial reduction in the thickness of the encapsulating material 20 due to the shape of the wrinkles transferred to the encapsulating material 20.

In addition, by the bag member 33 having a bag shape, it is possible to further suppress the encapsulating material 20 that leaked from the mold member 32 from leaking to the outside. Further, by filling the encapsulating material 20 inside the sheet-like mold member 32, which is harder than the bag member 33, the encapsulating material 20 can be formed into a predetermined shape. Therefore, there is no need to produce a mold to form the encapsulating material 20 into a predetermined shape.

Further, in this embodiment, as described above, the thickness t1 of the mold member 32 is larger than the thickness t2 of the bag member 33. With this, even if wrinkles are caused by the slackening of the bag member 33, the transfer of the wrinkled shape to the encapsulating material 20 can be more suppressed. Therefore, it is possible to suppress the partial reduction in the thickness of the encapsulating material 20 due to the shape of the wrinkles transferred to the encapsulating material 20.

Further, in this embodiment, as described above, the mold member 32 covers the second face 22 and the side face 23 of the encapsulating material 20 without covering the first face 21 of the encapsulating material 20. With this, the first face 21 of the encapsulating material 20 is exposed through the mold member opening 31a of the mold member 32. Therefore, before filling the encapsulating material 20, the encapsulating material 20 can be filled through the mold member opening 31a of the mold member 32, and after filling the encapsulating material 20, the first electronic component assembly 10 and the transformer 60 can be connected through the mold member opening 31a of the mold member 32.

Further, in this embodiment, as described above, the electronic component assembly includes the first circuit board 11 having a high-voltage generation circuit 12 that generates power with a voltage higher than that of the input power, and the second circuit board 51, which is arranged on the inner surface of the housing 40 and is not encapsulated by the encapsulating material 20. With this, it is possible to selectively encapsulate the first electronic component assembly 10 using the encapsulating material 20, thereby reducing the usage of the encapsulating resin and also reducing the increase in the weight of the power supply device 100. Therefore, it is possible to reduce the time required to complete the production of the power supply device 100.

Further, in this embodiment, as described above, it is further provided with the transformer 60, which is disposed between the first circuit board 11 and the second circuit board 51 and is not encapsulated by the encapsulating material 20. With this configuration, it is possible to selectively encapsulate electronic components using the encapsulating material 20, thereby reducing the usage of the encapsulating resin and also reducing the increase in the weight of the power supply device 100.

(Effects of Production Method of Power Supply Device of this Embodiment)

In the production method of the power supply device 100 of this embodiment, the following effects can be obtained.

In this embodiment, as described above, a step of arranging the enclosure member 30 in which the first electronic component assembly 10 is accommodated therein in a space serving an inside of the housing 40 as the main body of the power supply device 100, and a step of encapsulating the first electronic component assembly 10 by filling the encapsulating material 20 into the inside of the enclosure member 30 arranged in the space serving the inside of the housing 40. With this, it is possible to surround the encapsulating material 20 with the enclosure member 30 without welding or joining the corners of the housing 40 or other portions thereof. Therefore, it is possible to suppress leakage of the encapsulating material 20 filled in the housing 40 to the outside while preventing the production process from becoming complicated.

MODIFICATIONS

Note that the embodiments disclosed here should be considered illustrative and not restrictive in all respects. It should be noted that the scope of the present invention is indicated by claims and is intended to include all modifications (modified examples) within the meaning and scope of the claims and equivalents.

Further, in the above-described embodiment, an example is shown in which the enclosure member 30 includes the bag member 33 and the mold member 32, but the present invention is not limited thereto. For example, the enclosure member 30 may include the bag member 33 without including the mold member 32. Since the enclosure member 30 has a second linear expansion coefficient at the portion in contact with the encapsulating material 20, the linear expansion coefficient of the bag member 33 in this case is the second linear expansion coefficient.

Further, in the above-described embodiment, an example is shown in which the mold member 32 is harder than the bag member 33, but the present invention is not limited thereto. For example, the mold member 32 may have the same hardness as the bag member 33, or it may be made of a material softer than the bag member 33. Further, in the above-described embodiment, an example is shown in which the thickness t1 of the mold member 32 is larger than the thickness t2 of the bag member 33, but the present invention is not limited thereto. For example, the thickness t1 of the mold member 32 may be equal to or smaller than the thickness t2 of the bag member 33.

Further, in the above-described embodiment, an example is shown in which the mold member 32 is formed by two pieces of sheet-like members composed of the first mold member 32a and the second mold member 32b, but the present invention is not limited thereto. For example, the mold member 32 may be formed from one piece of a sheet-like member or three or more pieces of sheet-like members.

Further, in the above-described embodiment, an example is shown in which the mold member 32 is made of a resin material, such as, e.g., polycarbonate and polyethylene terephthalate, but the present invention is not limited thereto. For example, the mold member 32 can be made of a resin material, such as, e.g., polypropylene, polystyrene, polyvinyl chloride, and polyethylene, or a material other than a resin material.

Further, in the above-described embodiment, an example is shown in which the bag member 33 has a bag shape, but the present invention is not limited thereto. For example, the shape of the bag member 33 is not limited as long as it includes an opening 31 through which the encapsulating material 20 is exposed and also prevents the encapsulating material 20 inside from leaking to the outside.

Further, in the above-described embodiment, an example is shown in which the bag member 33 uses a resin material, such as, e.g., polyvinyl chloride and polyethylene, but the present invention is not limited thereto. For example, the bag member 33 can be made of a resin material, such as, e.g., polypropylene, polystyrene, polycarbonate, and polyethylene terephthalate, or a material other than a resin material.

Further, in the above-described embodiment, an example is shown in which the housing 40 is made of a material such as aluminum alloy, but the present invention is not limited thereto. For example, the housing 40 may be made of a material, such as, e.g., stainless steel and iron, other than an aluminum alloy, or may be made of a non-metallic material, such as, e.g., a resin material.

Further, in the above-described embodiment, an example is shown in which the encapsulating material 20 is made of a resin material, such as, e.g., urethane and silicone, but the present invention is not limited thereto. For example, the encapsulating material 20 may be made of an epoxy resin or the like.

Further, in the above-described embodiment, an example is shown in which the encapsulating material 20 encapsulating the first electronic component assembly 10 has a rectangular shape, but the present invention is not limited thereto. For example, the encapsulating material 20 may be formed in other shapes, such as, e.g., a cube shape, a cylinder shape, and a polyhedron shape. In this case, the mold member 32 can be formed to cover the encapsulating material 20 except for the first face 21.

Further, in the above-described embodiment, an example is shown in which the metal cover 70 as a jig is attached before filling the encapsulating material 20, the metal cover 70 is removed, and the second case 42 is attached after filling the encapsulating material 20, but the present invention is not limited thereto. For example, the metal cover 70 attached before filling the encapsulating material 20 may be used as the second case 42 without removing it after filling the encapsulating material 20.

Further, in the above-described embodiment, an example is shown in which the power supply device 100 is configured to output to an X-ray tube installed in an X-ray imaging apparatus, but the present invention is not limited thereto. For example, it may be configured to output to various devices that require a high voltage.

Further, in the above-described embodiment, an example is shown in which the power supply device 100 is equipped with the encapsulated first electronic component assembly 10 including the capacitor 13 and the diode 14, but the present invention is not limited thereto. The power supply device 100 may be a known transformer type high voltage generator or a known inverter type high voltage generator.

Further, in the above-described embodiment, an example is shown in which the power supply device 100 is equipped with the first electronic component assembly 10 and the transformer 60 inside the housing 40, but the present invention is not limited thereto. The first electronic component assembly 10 and the transformer 60 may be provided outside the housing 40 of the power supply device 100.

[Aspects]

It would be understood by those skilled in the art that the exemplary embodiments described above are specific examples of the following aspects.

(Item 1)

A power supply device comprising:

an electronic component assembly configuring a power supply;

an encapsulating material encapsulating the electronic component assembly, the encapsulating material having a first linear expansion coefficient;

an enclosure member with an inside thereof filled with the encapsulating material so as to cover the electronic component assembly, a portion of the enclosure member in contact with the encapsulating material having a second linear expansion coefficient; and a housing in which the electronic component assembly, the encapsulating material, and the enclosure member are arranged therein, the housing being formed by a member having a third linear expansion coefficient, wherein the first linear expansion coefficient of the encapsulating material is closer to the second linear expansion coefficient of the enclosure member than the third linear expansion coefficient of the member forming the housing.

(Item 2)

The power supply device as recited in the above-described Item 1, wherein the member forming the housing is made of metal, and the enclosure member is made of resin.

(Item 3)

The power supply device as recited in the above-described Item 1, wherein the enclosure member includes a bag member having an opening through which the encapsulating material is exposed, the bag member having a bag shape, and a sheet-like mold member arranged between the bag member and the electronic component assembly, the mold member having a second linear expansion coefficient and being harder than the bag member.

(Item 4)

The power supply device as recited in the above-described Item 3, wherein a thickness of the mold member is larger than that of the bag member.

(Item 5)

The power supply device as recited in the above-described Item 4, wherein the encapsulating material includes a first face exposed through the opening, a second face facing the first face, and a side face connecting the first face and the second face, and wherein the mold member covers the second face and the side face of the encapsulating material without covering the first face of the encapsulating material.

(Item 6)

The power supply device as recited in the above-described Item 1, wherein the electronic component assembly includes a first circuit board having a high-voltage generation circuit for generating power with a voltage higher than that of input power, and wherein the power supply device further comprises a second circuit board arranged on an inner surface of the housing, the second circuit board being not encapsulated by the encapsulating material.

(Item 7)

The power supply device as recited in the above-described Item 6, further comprising:

a transformer arranged between the first circuit board and the second circuit board, the transformer being not encapsulated by the encapsulating material.

(Item 8)

A production method of a power supply device, the method comprising:

a step of arranging an enclosure member in which an electronic component assembly constituting a power supply is accommodated in a space serving an inside of a housing of a power supply device main body; and a step of encapsulating the electronic component assembly by filling an inside of the enclosure member arranged in the space serving the inside of the housing with the encapsulating material.

The invention claimed is:

1. A power supply device comprising:

an electronic component assembly configuring a power supply;

an encapsulating material encapsulating the electronic component assembly, the encapsulating material having a first linear expansion coefficient;

an enclosure member with an inside thereof filled with the encapsulating material so as to cover the electronic component assembly, a portion of the enclosure member in contact with the encapsulating material having a second linear expansion coefficient; and a housing in which the electronic component assembly, the encapsulating material, and the enclosure member are arranged therein, the housing being formed by a member having a third linear expansion coefficient, wherein the first linear expansion coefficient of the encapsulating material is closer to the second linear expansion coefficient of the enclosure member than the third linear expansion coefficient of the member forming the housing.

2. The power supply device as recited in claim 1, wherein the member forming the housing is made of metal, and the enclosure member is made of resin.

3. The power supply device as recited in claim 1, wherein the enclosure member includes a bag member having an opening through which the encapsulating material is exposed, the bag member having a bag shape, and a sheet-like mold member arranged between the bag member and the electronic component assembly, the mold member having a second linear expansion coefficient and being harder than the bag member.

4. The power supply device as recited in claim 3, wherein a thickness of the mold member is larger than that of the bag member.

5. The power supply device as recited in claim 4, wherein the encapsulating material includes a first face exposed through the opening, a second face facing the first face, and a side face connecting the first face and the second face, and wherein the mold member covers the second face and the side face of the encapsulating material without covering the first face of the encapsulating material.

6. The power supply device as recited in claim 1, wherein the electronic component assembly includes a first circuit board having a high-voltage generation circuit for generating power with a voltage higher than that of input power, and wherein the power supply device further comprises a second circuit board arranged on an inner surface of the housing, the second circuit board being not encapsulated by the encapsulating material.

7. The power supply device as recited in claim 6, further comprising:

a transformer arranged between the first circuit board and the second circuit board, the transformer being not encapsulated by the encapsulating material.

8. A production method of a power supply device, the method comprising:

a step of arranging an enclosure member in which an electronic component assembly constituting a power supply is accommodated in a space serving an inside of a housing as a power supply device main body; and a step of encapsulating the electronic component assembly by filling an inside of the enclosure member arranged in the space serving the inside of the housing with the encapsulating material.

* * * * *